United States Patent [19]

Hutt et al.

[11] Patent Number: 5,670,447
[45] Date of Patent: Sep. 23, 1997

[54] 35MM FORMAT TRANSPARENCIES

[75] Inventors: Kenneth West Hutt, Wix; Ian Richard Stephenson, Felsted; Ha Cong Viet Tran, Northfield, all of Great Britain

[73] Assignee: Imperial Chemical Industries PLC, United Kingdom

[21] Appl. No.: 407,020

[22] PCT Filed: Oct. 12, 1993

[86] PCT No.: PCT/GB93/02104

§ 371 Date: May 16, 1995

§ 102(e) Date: May 16, 1995

[87] PCT Pub. No.: WO94/08795

PCT Pub. Date: Apr. 28, 1994

[30] Foreign Application Priority Data

Oct. 13, 1992 [GB] United Kingdom .................. 9221502

[51] Int. Cl.⁶ .............................. B41M 5/035; B41M 5/38
[52] U.S. Cl. ........................ 503/227; 40/159.2; 428/13; 428/195; 428/210; 428/913; 428/914
[58] Field of Search ........................ 8/471; 428/195, 428/913, 914, 204, 13, 14, 210; 503/227; 40/159.2

[56] References Cited

U.S. PATENT DOCUMENTS 4,910,188  3/1990  Akada et al. ................... 503/227
5,322,832  6/1994  Takeyama et al. .............. 503/227

OTHER PUBLICATIONS

Derwent Publication JP-A-2049239 Feb. 1990.

*Primary Examiner*—Bruce H. Hess

[57] ABSTRACT

A 35 mm format transparency comprising a dye diffusion thermal printing receiver sheet consisting of a transparent substrate having on one surface thereof an image layer on which the image is formed by thermal dye transfer using a laser as the source of heat to effect the thermal transfer, the transparent substrate and the image layer consisting of materials having, in combination, a moisture absorption of less than 1.5% and being positioned removably between two transparent glass sheets.

2 Claims, No Drawings

35MM FORMAT TRANSPARENCIES

This invention relates to 35 mm format "transparencies" which can, in well known manner, be used in a projector to provide a magnified version of an image stored on the transparency.

Conventionally such transparencies are produced photographically and hence consist of a transparent substrate having thereon a gelatin coating containing light sensitive chemicals in which the image is formed by exposure to light in a camera and then treatment by suitable developing techniques.

Such transparencies are relatively delicate physically and are easily scratched. It is common practice, therefore, to place the actual transparency between two sheets of glass for protection.

However, under certain conditions, this can produce a disadvantageous side effect.

Both gelatin and cellulose triacetate (the base film most commonly used for photographic film) are hygroscopic and, therefore, have an equilibrium water content which depends on the relative humidity and the temperature at which they are stored. (Gelatin/silver halide emulsion combinations are about ten times more hygroscopic than cellulose triacetate). What is more, the level of moisture in a photographic film needs to be controlled to give optimum film properties. Levels that are too low lead to problems with film brittleness, curl, static and dimensional changes and levels that are too high lead to tackiness of the film and can lead to ferrotyping problems.

When the transparency is placed in a projector a portion of the light transmitted through the transparency to form the magnified image is absorbed by the transparency image. The transparency, therefore is heated more rapidly than the glass and a temperature gradient is produced at the interface between the transparency and the glass. The moisture present in the gelatin can condense out and cause fogging or distortion of the projected image until temperature equilibrium between the transparency and the glass is reached. Clearly, the greater the initial temperature gradient, the more pronounced the effect is likely to be.

It is an object of this invention to obviate this effect.

According to one aspect of the invention, there is provided a 35 mm format transparency comprising a transparent substrate having an image on one surface thereof and positioned between two transparent protective layers, characterised in that the transparent substrate and the image layer consist of materials having, in combination, a moisture absorption of less than 1.5%

Preferably, the moisture absorption is less than 1%.

According to a preferred aspect of the invention, the transparent substrate and image layer together comprise a dye diffusion thermal transfer receiver sheet, in which the image is formed by dye diffusion thermal transfer techniques.

Dye diffusion thermal transfer is a generic term for processes in which one or more thermally transferable dyes are caused to transfer from a dye sheet to a receiver sheet in response to thermal stimuli. Using a dye sheet comprising a thin substrate supporting a dye coat containing one or more such dyes uniformly spread over an entire printing area of the dye sheet, image production can be effected by heating selected discrete areas of the dye sheet while the dye sheet is in contact with a receiver sheet, thereby causing dye to transfer to corresponding areas of that receiver sheet. Full colour, high resolution photographic quality images can be produced by using different coloured dye coats sequentially in like manner and appropriate equipment, such as a progammable thermal print head or laser controlled by electronic signals derived from, for example a video camera or similar signal generating apparatus. The resolution is particularly high if a laser is used and in practice such a heat source is preferred for 35 mm transparency preparation.

A typical receiver sheet consists of a substrate, supporting a receiver coat of a dye receptive composition containing a material highly receptive to the dyes being transferred and containing additives to promote the release of the dye sheet from the receiver sheet after imaging has taken place. For use in 35 mm format transparencies, the receiver sheet must, of course, be transparent.

Substrate materials having a moisture absorption of less than 1% and which are preferred for use in the present invention are polyesters such as polyethylene terephthalate, polyethylene aphthanate or polybutylene terephthalate or polyolefins such as polypropylene. Alternatively, polycarbonate or polyvinyl chloride may be used.

The receiver coat may be formed from any material which is solvent coatable, compatible with the dyes being used and has a moisture absorption of less than 1%. Particularly suitable are solvent soluble polyesters, for example, Vylon polyesters made by Toyosho, but polyvinyl chloride and styrene-acrylonitrile copolymer may also be used. These materials may be used alone or as mixtures.

The invention will be more readily understood from the following examples.

EXAMPLE 1

An electronically stored image was recorded as a 35 mm transparency on to standard E6 Kodak photographic film using a Polaroid C15000 printer. The same image was then recorded on to a laser thermal transfer receiver sheet by holding the receiver sheet together with three separate dye sheets (comprising coatings of thermally transferable dye and polymeric binder on 23 µm Melinex, the three dye sheets having yellow, magenta and cyan dyes respectively) by the application of one atmosphere pressure. A SpectroDiode Laboratories 150 mw diode laser operating at 807 nm was focussed down into the dye sheet/receiver sheet combination and scanned across so as to build up the appropriate dye transfer.

The receiver sheet consisted of a transparent polyethylene terephthalate (125 µm Melinex from ICI) film coated with the following formulation from a 50/50 mixture of toluene/ethyl methyl ketone:

| Vylon 200 | 30 parts | Cymel 303 | 6 parts |
|---|---|---|---|
| Vylon 103 | 70 parts | Tergomer HSi 2210 | 0.7parts |
| Ketjenflex MH | 7.5 parts | Tinuvin 900 | 1 part |
| R 4046 | 0.4 parts | | | to a dry coat thickness of 3 µm which was cured at 140° C. for three minutes. (Vylon 200 and Vylon 103 are polyesters having a high dye affinity sold by Toyobo; Tergomer HSi 2210 is a bis-hydroxyalkyl polydimethylsiloxane sold by Th Goldschmidt, Cymel 303 is a hexamethoxymethylmelamine oligomeric cross-linking agent from American Cyanamid, Ketjenflex MH is a toluene sulphonamide/formaldehyde condensate from Akzo, Tinuvin 900 is a UV light absorber sold by Ciba-Geigy and R4046 is an amine blocked p-toluene sulphonic acid catalyst).

Both transparencies were placed in protective glass mounts and, with the mounts open were placed in a humidity ageing cabinet held at 45° C. and 85% RH for 5 minutes. The transparencies were then removed, closed and allowed to equilibrate to ambient conditions. The images were then projected on to a white screen using a Kodak S V 2010 projector. After 5 seconds the E6 image darkened due to condensation of water on the inside of the glass mount. The darkened areas gradually lightened as the condensed water evaporated and 5 minutes elapsed before all the water had gone. No such darkening occurred with the thermal transfer image. The thermal transfer image was replaced in the humidity cabinet for a further 72 hours and again tested in the projector. No condensation was present.

EXAMPLE 2

The moisture uptake of three film samples was determined by storing them in a humidity ageing cabinet held at 45° C. and 85% RH for 72 hours, accurately weighing them, transferring them to a vacuum oven held at 120° C. and 1 cm of mercury for 3 hours and re-weighing them, the % moisture uptake being calculated from the difference between the dry and "wet" weights of the samples.

The samples tested were:

Sample 1. A roll of standard 35 mm film comprising a silver halide emulsion on cellulose triacetate base.

Sample 2. A sheet of exposed lithographic film comprising a silver halide emulsion on a polyethylene terephthalate base.

Sample 3. A sheet of thermal transfer receiver sheet as described in Example 1.

The moisture uptake values obtained were as follows:

| Sample | Moisture Uptake(%) |
|--------|--------------------|
| 1      | 3.81               |
| 2      | 1.33               |
| 3      | 0.57               |

We claim:

1. A 35 mm format transparency comprising a dye diffusion thermal printing receiver sheet consisting of a transparent substrate having on one surface thereof an image layer on which the image is formed by thermal dye transfer using a laser as the source of heat to effect the thermal transfer, the transparent substrate and the image layer consisting of materials having, in combination, a moisture absorption of less than 1.5% and being positioned removably between two transparent, glass sheets.

2. A transparency according to claim 1, in which the moisture absorption is less than 1.0%.

* * * * *